US006801555B1

(12) United States Patent
DiJaili et al.

(10) Patent No.: US 6,801,555 B1
(45) Date of Patent: Oct. 5, 2004

(54) LASING SEMICONDUCTOR OPTICAL AMPLIFIER WITH OUTPUT POWER MONITOR AND CONTROL

(75) Inventors: Sol P. DiJaili, Moraga, CA (US); Jeffrey D. Walker, El Cerrito, CA (US)

(73) Assignee: Finisar Corporation, Sunnyvale, CA (US)

( * ) Notice: Subject to any disclaimer, the term of this patent is extended or adjusted under 35 U.S.C. 154(b) by 87 days.

(21) Appl. No.: 10/092,455

(22) Filed: Mar. 6, 2002

Related U.S. Application Data

(60) Continuation-in-part of application No. 10/033,550, filed on Dec. 27, 2001, which is a division of application No. 09/299,824, filed on Apr. 26, 1999, now Pat. No. 6,347,104
(60) Provisional application No. 60/274,428, filed on Mar. 9, 2001.

(51) Int. Cl.[7] .................................................. H01S 3/00
(52) U.S. Cl. ..................... 372/37; 372/38.02
(58) Field of Search .................. 372/38.01, 38.02, 372/38.06, 38.07, 38.09, 19, 26, 27, 37, 32, 50, 38.1

(56) References Cited

U.S. PATENT DOCUMENTS

| | | | |
|---|---|---|---|
| 3,467,906 A | 9/1969 | Cornely et al. | 330/4.3 |
| 3,828,231 A | 8/1974 | Yamamoto | 357/30 |
| 4,794,346 A | 12/1988 | Miller | 330/4.3 |
| 5,299,054 A | 3/1994 | Geiger | 359/251 |
| 5,305,412 A | 4/1994 | Paoli | 385/122 |
| 5,436,759 A | 7/1995 | DiJaili et al. | 359/333 |
| 5,604,628 A | 2/1997 | Parker et al. | 359/344 |
| 5,659,560 A * | 8/1997 | Ouchi et al. | 372/27 |
| 5,754,571 A * | 5/1998 | Endoh et al. | 372/20 |
| 5,771,320 A | 6/1998 | Stone | 385/16 |
| 5,778,132 A | 7/1998 | Csipkes et al. | 385/135 |
| 5,805,322 A * | 9/1998 | Tomofuji | 398/177 |
| 5,999,293 A | 12/1999 | Manning | 359/139 |
| 6,061,156 A | 5/2000 | Takeshita et al. | 359/117 |
| 6,115,517 A | 9/2000 | Shiragaki et al. | 385/24 |
| 6,128,115 A | 10/2000 | Shiragaki | 359/128 |
| 6,317,531 B1 | 11/2001 | Chen et al. | 385/17 |
| 6,333,799 B1 | 12/2001 | Bala et al. | 359/128 |

(List continued on next page.)

FOREIGN PATENT DOCUMENTS

| | | | |
|---|---|---|---|
| JP | 56006492 | 1/1981 | H01S/3/18 |

OTHER PUBLICATIONS

Alcatel, "Alcatel Optronics introduces a Gain–Clamped Semiconductor Optical Amplifier," *Press Release for Immediate Publication*, OFC '98, San Jose (Feb. 1998), 1 unnumbered page.

(List continued on next page.)

*Primary Examiner*—Don Wong
*Assistant Examiner*—Tuan N. Nguyen
(74) *Attorney, Agent, or Firm*—Workman Nydegger

(57) ABSTRACT

An optical signal power monitoring and control system is described. The system comprises at least one lasing SOA that receives, amplifies, and outputs the optical signal. During the signal amplification, a ballast laser signal is output through a substrate of the lasing SOA. This ballast laser signal is indicative of the output power of the lasing SOA. At least one detector converts the ballast laser signal to an electrical signal and transmits this electrical signal to a power monitor circuit. Using the electrical signal, the power monitor determines the output power of the lasing SOA. A pump control adjusts the rate at which the lasing SOA is pumped in order to change the saturation level of the lasing SOA and its corresponding power output ceiling. According to one embodiment, the power monitor identifies when the lasing SOA is approaching saturation or is saturated. If the lasing SOA is saturated or approaching saturation, the pump control increases its pumping rate causing the saturation level of the lasing SOA to rise. As a result, the lasing SOA is provided protection from saturation.

36 Claims, 11 Drawing Sheets

U.S. PATENT DOCUMENTS

| | | | |
|---|---|---|---|
| 6,335,992 B1 | 1/2002 | Bala et al. | 385/17 |
| 6,452,719 B2 * | 9/2002 | Kinoshita | 359/337.2 |
| 6,459,527 B1 * | 10/2002 | Kosaka | 359/337.1 |
| 6,459,709 B1 * | 10/2002 | Lo et al. | 372/20 |

OTHER PUBLICATIONS

Diez, S. et al., "Gain–Transparent SOA–Switch for High–Bitrate OTDM Add/Drop Multiplexing," *IEEE Photonics Technology Letters*, vol. 11, No. 1 (Jan. 1999), pp. 60–62.

Diez, S. et al., "Novel Gain–Transparent SOA–Switch for High Bitrate OTDM Add/Drop Multiplexing," ECOC '98, Madrid, Spain (Sep. 1998), pp. 461–462.

Diez, S. et al., "All–Optical Switch for TDM and WDM/TDM Systems Demonstrated in a 640Gbit/s Demultiplexing Experiment," *Electronics Letters*, vol. 34, No. 8 (Apr. 16, 1988), pp. 803–805.

Dorgeuille, F. et al., "1.28 Tbit/s Throughput 8/Spl Times/8 Optical Switch Based on Arrays of Gain–Clamped Clamped Semiconductor Optical Amplifier Gates," OFCC 2000, Baltimore, MD, Mar. 2000, vol. 4, pp. 221–223.

Dorgeuille, F. et al., "Fast Optical Amplifier Gate Array for WDM Routing and Switching Applications," OFC'98 Technical Digest, pp. 42–44.

Doussiere, P. et al., "Clamped Gain Travelling Wave Semiconductor Optical Amplifier for Wavelength Division Multiplexing Applications," Maui, Hawaii, Sep. 19–23, 1994, New York, IEEE, US, vol. Conf. 14 (Sep. 14, 1994), pp. 185–186.

Evankow, JosephD. et al., "Photonic Switching Modules Designed With Laser Diode Amplifiers," *IEEE Journal on Selected Areas in Communications*, vol. 6, No. 7 (Aug. 1988), pp. 1087–1095.

Fernier, B. et al., "Fast ( 300 ps) Polarization Insensitive Semiconductor Optical Amplifier Switch With Low Driving Current (70 mA)," Semiconductor Laser Conference, Sep. 1992, pp. 130–131.

Fouguet, J.E. et al., "Compact, Scalable Fiber Optic Cross–Connected Switches," *Digest of the LEOS Summer Topical Meetings*, San Diego, CA, Jul. 1999, pp. 59–60.

Ibrahim, Magdy M., "Photonic Switch Using Surface–Emitting Laser Diode and APD," NRSC '99, Cairo, Egypt, Feb. 1999, pp. D7 1–D7 8.

Jeong, Gibong et al., "Gain Optimization in Switches Based on Semiconductor Optical Amplifiers," *Journal of Lightwave Technology*, vol. 13, No. 4 (Apr. 1995), pp. 598–605.

Kitamura, Shotaro, et al., "Spot–Size Converter Integrated Semiconductor Optical Amplifiers for Optical Gate Applications," *IBEE Journal of Quantum Electronics*, vol. 35, No. 7 (Jul. 1999), pp. 1067–1074.

Leuthold, Juerg et al., "All–Optical Space Switches with Gain and Principally Ideal Extinction Ratios," *IBEE Journal of Quantum Electronics*, vol. 34, No. 4 (Apr. 1998), pp. 622–633.

McAdams, Larry R. et al., "Linearizing High Performance Semiconductor Optical Amplifiers: Techniques and Performance," LEOS Presentation (1996), Thursday 11:00 AM, pp. 363–364.

Mork, J., et al., "Semiconductor Devices for All–Optical Signal Processing: Just How Fast Can They Go?," LEOS '99, San Francisco, CA, Nov. 1999, vol. 2, pp. 900–901.

Mutalik, Venkatesh G. et al., "Analog Performance of 1310–nm Gain–Clamped Semiconductor Optical Amplifiers," *OFC '97 Technical Digest*, Thursday 11:15 AM, pp. 266–267.

Panajotov, K. et al., "Polarisation Switching In Proton–Implanted VCSELs," *Digest of the LEOS Summer Topical Meetings*, San Diego, CA (Jul. 1999), Thursday 2:45 PM, pp. 11155–11156.

Qiu, B.C. et al., "Monolithically Integrated Fabrication of 2×2 and 4×4 Crosspoint Switches Using Quantum Well Intermixing," Indium Phosphide and Related Materials, Conference Proceedings, Williamsburg, VA (May 2000), pp. 415–418.

Scheuer, J. et al., "Nonlinear On–Switching of High Spatial Frequency Patterns in Ring Vertical Cavity Surface Emitting Lasers," LEOS '99, San Francisco, CA (Nov. 1999), vol. 1, pp. 123–124.

Soto, H. et al., "All–Optical Switch Demonstration Using a Birefringence Effect In A Semiconductor Optical Amplifier," *CLEO Pacific Rim '99*, pp. 888–889.

Soulage, G. et al., "Clamped Gain Travelling Wave Semiconductor Optical Amplifier as a Large Dynamic Range Optical Gate," Alcatel Alsthom Recherche, route de Nozay, 91460 Marcoussis, France, undated, 4 unnumbered pages.

Tai, Chien et al., "Dynamic Range and Switching Speed Limitations of an N×N Optical Packet Switch Based on Low–Gain Semiconductor Optical Amplifiers," *Journal of Lightwave Technology*, vol. 14, No. 4 (Apr. 1996), pp. 525–533.

Tiemeijer, L.F. et al., "High–Gain 1310 nm Semiconductor Optical Amplifier Modules with a Built–in Amplified Signal Monitor for Optical Gain Control," *IEEE Photonics Technology Letters*, vol. 9, No. 3 (Mar. 1997), pp. 309–311.

Tiemeijer, L.F. et al., "Reduced Intermodulation Distrotion in 1300 nm Gain–Clamped MQW Laser Amplifiers," *IEE Photonics Technology Letters*, vol. 7, No. 3 (Mar. 1995), pp. 284–286.

Toptchiyski, Gueorgui et al., "Time–Domain Modeling of Semiconductor Optical Amplifiers for OTDM Applications," *Journal of Lightwave Technology*, vol. 17, No. 12 (Dec. 1999), pp. 2577–2583.

van Roijen, R. et al., "Over 15 dB Gain From A Monolithically Integrated Optical Switch With An Amplifier," *IEEE Photonics Technology Letters*, vol. 5, No. 5 (May 1993), pp. 529–531.

Walker, J.D. et al., "A Gain–Clamped, Crosstalk Free, Vertical Cavity Lasing Semiconductor Optical Amplifier for WDM Applications," summaries of the papers presented at the topical meeting, *Integrated Photonics Search; 1996 Technical Digest Series; Proceedings of Integrated Photonics*; Boston, MA, USA, 29.04–02.05 1996, vol. 6, 1996, pp. 474–477.

Yoshimoto, N. et al., "Spot–Size Converted PolarizationInsensitive SOA Gate With A Vertical Tapered Submicrometer Strip Structure," *IEEE Photonics Technology Letters*, vol. 10, No. 4 (Apr. 1998), pp. 510–512.

* cited by examiner

LASING SEMICONDUCTOR OPTICAL AMPLIFIER WITH OUTPUT POWER MONITOR AND CONTROL

CROSS-REFERENCE TO RELATED APPLICATIONS

This application is a continuation-in-part of U.S. patent application Ser. No. 10/033,550, entitled "Optical Signal Power Monitor and Regulator," by Sol P. DiJaili and Jeffrey D. Walker, filed Dec. 27, 2001, which is a divisional application of Ser. No. 09/299,824 now U.S. Pat. No. 6,347,104, entitled "Optical Signal Power Monitor and Regulator," by Sol P. DiJaili and Jeffrey D. Walker, filed Apr. 26, 1999; and claims priority from provisional U.S. Patent Application Ser. No. 60/274,428, entitled "Semiconductor Optical Amplifiers for Controlling Power in a Network," by Sol P. DiJaili and Jeffrey D. Walker, filed Mar. 9, 2001. The subject matter of the foregoing application is incorporated herein by reference.

BACKGROUND

A. Technical Field

The present invention relates generally to power control within an optical network, and more particularly, to power detection on a semiconductor optical amplifier, and in response, adjustment of a power saturation level on the semiconductor optical amplifier.

B. Background of the Invention

Service providers are experiencing an ever-increasing demand for bandwidth fueled by Internet access, voice, data, and video transmissions and this demand for bandwidth will likely continue to grow. Due to this demand, network capacities are being stretched to their limit. As a result, there has been an increasing effort to lay fiber in order to expand the capacity of existing networks and build new higher capacity networks.

Optical amplifiers, which boost the power of optical signals within these networks, are a basic building block for many types of optical systems. Fiber optic communications systems typically require the use of optical amplifiers in order to properly carry optical information within a network. A typical communications system includes a transmitter connected to a receiver via fiber. The transmitter incorporates information into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for these attenuations and degradations by amplifying the optimal signal to an appropriate power level. Moreover, receivers typically operate properly only within a narrow range of optical signal power levels; and optical amplifiers are used to boost an optical signal to the proper power range for the receiver.

Networks may place different power output requirements on optical amplifiers. For example, an OC-192 network having 48 channels requires a higher amplifier power output than an OC-3 network containing 12 channels. This difference is caused by the increased rate of the OC-192 network and the larger number of channels within the network. In the new switched metro WDM links with Gb/s data channels, it is important that optical amplifiers within the network do not saturate. Saturation occurs when an optical amplifier is unable to sufficiently amplify an optical signal to a desired power level that is above the amplifier's power saturation level. This power saturation level defines an output power ceiling above which the optical amplifier does not operate properly.

The power saturation level of a semiconductor optical amplifier (SOA) is defined by a number of factors including the characteristics of the active region operating within the SOA and the rate at which the active region is pumped. Saturation occurs when an active region within an SOA is unable to effectively amplify at least one channel within the optical signal. This failure is caused by insufficient power within the active region to amplify each channel to a proper power level resulting in one or more channels not being properly amplified. This phenomenon is called crosstalk and may degrade a signal, or a channel within the signal, to the point of not being readable at a receiver within the network. Channel crosstalk is an important consideration that needs to be addressed when optical networks are designed or scaled.

In order to effectively scale existing optical networks, a service provider should be able to control power levels on signals traveling across a network. As the number of channels expands and/or the data rate increases within a network, the power output requirement of the amplifiers within the network will also likely increase. This increase is caused by the fact that the required gain applied to each channel remains constant while the number of channels within the optical signal increases. Accordingly, network managers typically address this issue in a number of different ways when a network is scaled. First, a network manager may replace some or all of the amplifiers within amplifiers having higher output power. Second, a network manager may insert additional amplifiers within the network. Third, a network manager may increase the output power of existing amplifiers within the network.

SOAs allow network managers to adjust output power because they typically may have a tunable pump source. As previously mentioned, in practice, the output power of an SOA depends, at least in part, on the rate at which the active region is pumped. Accordingly, network managers may increase an SOA power output by increasing the current pumping the active region. However, this process is currently time consuming and inaccurate because of the lack of real time data regarding power output on each of the optical amplifiers.

Power monitoring traditionally required that an optical signal be tapped in order to determine a power level. One such tapping method is the use of a power coupler positioned within a piece of fiber. This tapping process reduces the power level on the optical signal and adds more fiber components, cost, and space to increasingly complex fiber systems. Accordingly, data regarding specific power levels on each optical amplifier is generated at a power expense to the optical signal and may not be as exact as a network manager may desire. As a result, optical network designers generally try to minimize the number of taps within a network.

Accordingly, there is a need for a system and method that monitors and controls an optical amplifier output power level by adjusting the rate at which the optical amplifier is pumped. Additionally, there is a further need for this system to avoid tapping an optical signal while monitoring and controlling the optical amplifier in order to reduce power loss to the optical signal.

SUMMARY OF THE INVENTION

The present invention overcomes the deficiencies and limitations of the prior art by providing an optical amplifier with an output power monitor and control system. In particular, the present invention provides an optical power detection system that avoids the use of power couplers or taps by detecting a ballast laser signal emitted from a lasing semiconductor optical amplifier (SOA). The lasing SOA emits the ballast laser signal in response to the amplification of the optical signal. Examples of lasing SOAs include vertical lasing SOAs, horizontal lasing SOAs, and longitudinal lasing SOAs. The invention comprises an optical detector that converts the ballast laser signal to an electrical signal, a power monitor device that identifies the output power on the lasing SOA, and a tunable pump that pumps an active region within the lasing SOA.

An optical signal propagates through an amplification path within the lasing SOA causing the signal to be amplified. A laser cavity within the amplification path contains a semiconductor gain medium that is pumped above a lasing threshold for the laser cavity. As a result, lasing occurs producing laser radiation within the laser cavity. This laser radiation operates as a ballast to prevent gain saturation within the laser cavity during the amplification of the optical signal. As a result, the gain within the laser cavity is clamped causing the laser radiation to be emitted as a ballast laser signal.

This ballast laser signal corresponds to the strength of the optical signal within the laser cavity because the laser cavity gain is clamped. The present invention utilizes this relation to determine a power level of an optical signal as it propagates through a lasing SOA. In one embodiment of the invention, a detector is positioned proximate a surface on the lasing SOA that emits this ballast laser signal. For example, a detector may be integrated on the ballast laser emitting surface near the output of the lasing SOA. This detector converts the ballast laser light near the output to an electrical signal from which the output power may be determined.

A power monitor receives the electrical signal and identifies if the lasing SOA is approaching or has exceeded a power saturation level corresponding to the lasing SOA. If the power monitor determines that the lasing SOA is approaching or is currently saturated, then a pump source, coupled to the power monitor, is signaled. The pump source controls the rate at which the active region within the lasing SOA is pumped. In response to this signal from the power monitor, the pump source increases or decreases its pumping rate. This change in the pumping rate either raises or lowers the power saturation level of the lasing SOA, thereby, reducing the danger of saturating the lasing SOA. Thus, the power saturation level is dynamically increased when the lasing SOA output power approaches the power saturation level or may be decreased if the lasing SOA is not in any danger of saturating. In contrast to non-lasing SOAs, the saturation power level of the lasing SOA is directly affected and proportional to the pump current level.

The power monitor may also be used to control other optical amplifiers within a network such as a pair of SOAs coupled in series. For example, a power monitor may increase a pumping rate on a second lasing SOA in response to the above described power detection of a first lasing SOA. Accordingly, optical signal power levels may be detected on a first lasing SOA and, in response; a power saturation level may be adjusted on a second lasing SOA. Additionally, this power monitor and control may be centralized within a single unit that addresses multiple lasing SOAs within a network. This centralization allows for easier network management and control because the power saturation levels of many lasing SOAs may be adjusted at a single location.

The figures depict an embodiment of the present invention for purposes of illustration only. One skilled in the art will recognize from the following discussion that alternative embodiments of the structures and methods illustrated herein may be employed without departing from the principles of the invention described herein.

DETAILED DESCRIPTION OF THE EMBODIMENTS

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

A. Optical Amplifiers a) Fiber Amplifier

Figure 1:
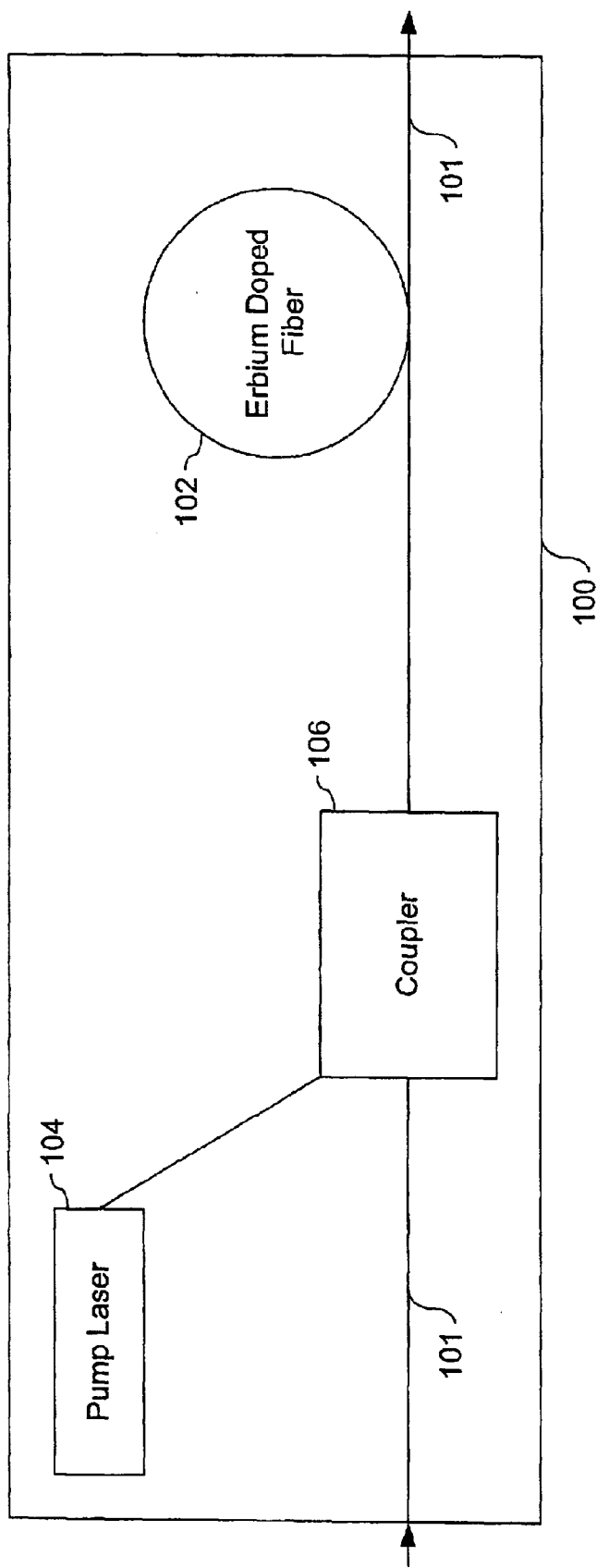
FIG. 1 is an illustration of a prior art Erbium doped fiber amplifier.

FIG. 1 is a block diagram of an erbium doped fiber amplifier (EDFA) 100. The EDFA 100 typically includes about 20 meters of erbium-doped fiber 102 inserted into the fiber optics. A pump laser 104 provides light to excite the ions in the erbium-doped fiber 102, and a wavelength coupler 106 couples the light from the pump laser 104 to the fiber optics 101. The doped fiber 102 is pumped so that electrons within the dopant are excited into higher energy orbitals. The pump typically is an optical source whose wavelength is preferentially absorbed by the ions and yet different from the optical signal to be amplified. The optical signal is input from un-doped fiber to the doped fiber, experiences gain due to stimulated emission of photons by electrons falling from higher energy orbitals as the optical signal passes through the doped fiber, and then is output in amplified form from the doped fiber to further un-doped fiber.

Fiber amplifiers are limited in the environment in which they may be used. For example, fiber amplifiers can only amplify a narrow range of wavelengths that they can amplify, thereby requiring fiber amplifiers to be cascaded when wider wavelength bands are amplified. Additionally, fiber amplifiers have a transient response to channel drop-out in wavelength division multiplexing systems. Finally, fiber amplifiers are relatively large, unable to provide high switching speeds, consume a large amount of power, difficult to mass produce, and costly.

b) Semiconductor Optical Amplifier

Figure 2:
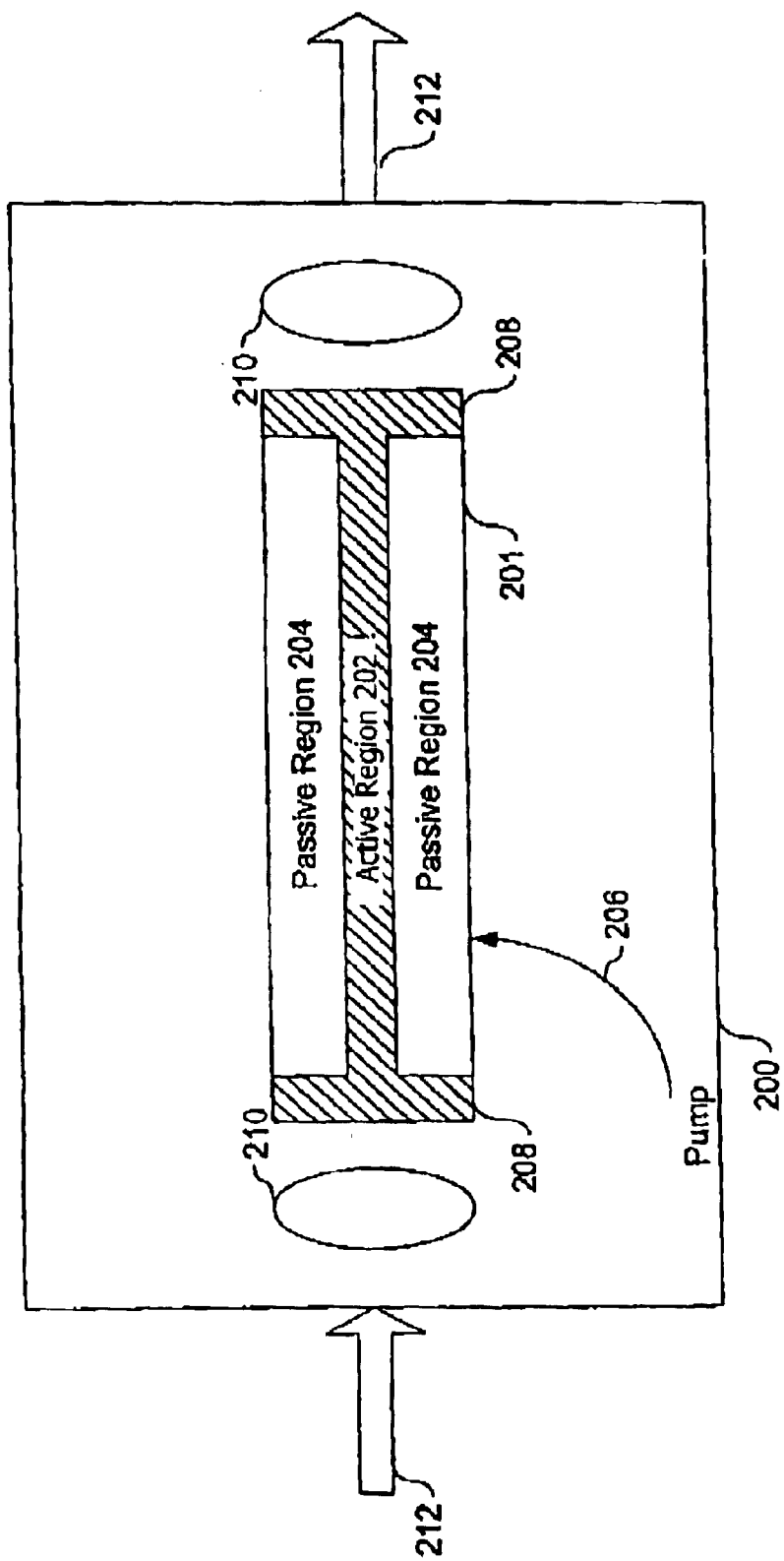
FIG. 2 is an illustration of a prior art semiconductor optical amplifier.

FIG. 2 is a block diagram of a conventional semiconductor optical amplifier (SOA) 200. The conventional SOA 200 comprises a semiconductor part 201 having an active region 202 and passive regions 204. The active region 202 comprises a semiconductor gain medium that amplifies an optical signal as it passes through the SOA 200. The passive regions 204 comprise wide band-gap semiconductor cladding regions that restrict the optical signal to the higher index of refraction active region 202. The edges of the semiconductor part 201 have antireflection coatings 208 that ensure the semiconductor part 201 operates below a lasing threshold. The SOA 200 is coupled to fiber optics by lenses 210 designed to direct light into the semiconductor part 201.

Like fiber amplifiers, conventional SOAs are limited in the environment in which they may be used. For example, conventional SOA 200 have problems with gain variation and crosstalk induced by the input signal. Avoiding crosstalk is especially important for wavelength division multiplexing (WDM) applications, but it is also important due to intersymbol interference in time-division multiplexing (TDM) applications and due to harmonic distortion in radio frequency (RF) applications. In addition, carrier lifetime in the conventional SOA 200 is limited to on the order of 1 nanosecond which gives rise to significant TDM crosstalk near 1 GHz and higher, and significant WDM crosstalk up to 1 GHz and higher (note that stimulated emission may speed up the reaction time of the gain medium). However, data rates on the order of magnitude of 1 GHz and higher are becoming very significant for current and future optical communications.

c) Vertical Lasing Semiconductor Optical Amplifier

Figure 3:
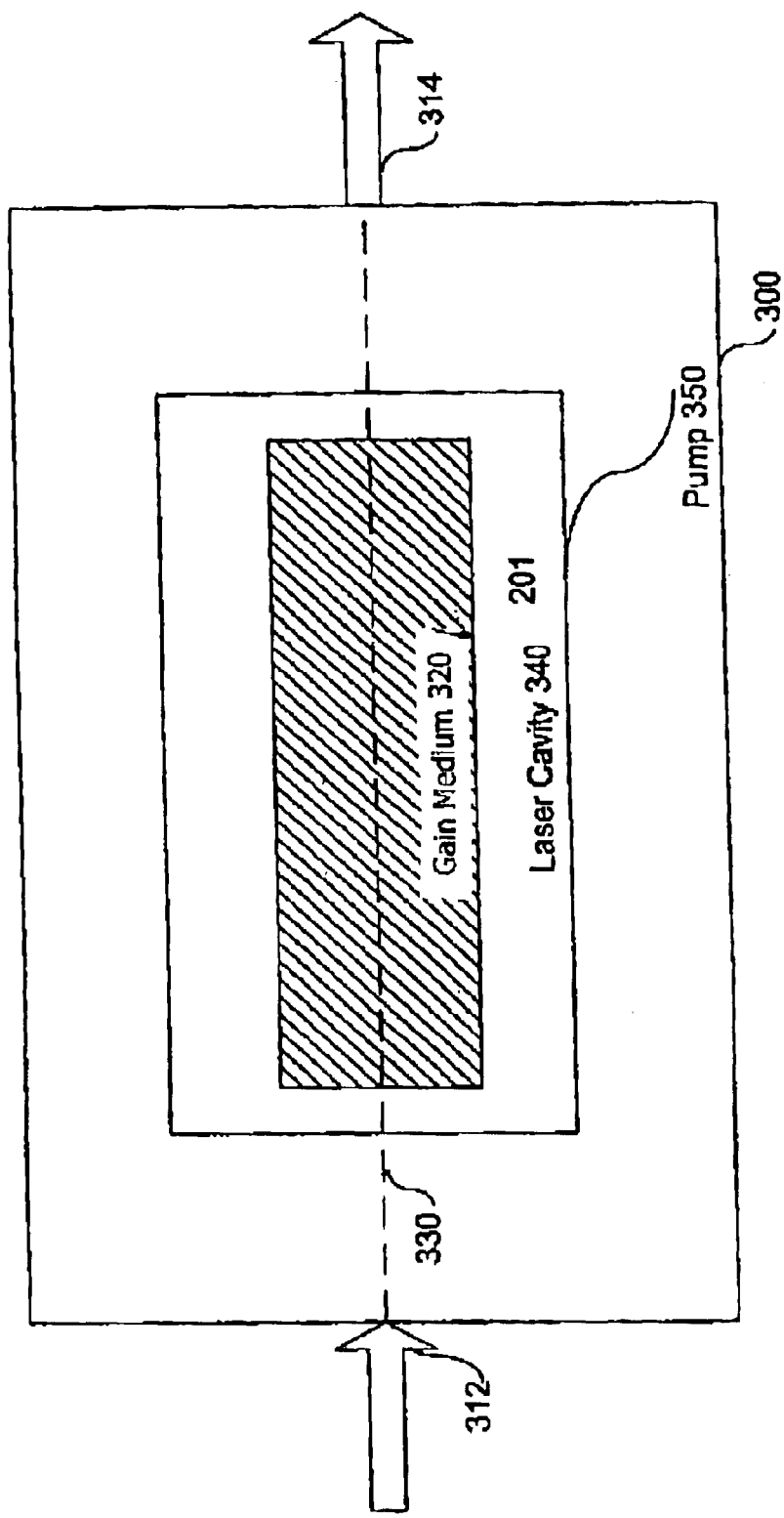
FIG. 3 is an illustration of a lasing semiconductor optical amplifier according to the present invention.

FIG. 3 is a diagram of a vertical lasing semiconductor optical amplifier (VLSOA) 300 in accordance with the present invention. The VLSOA 300 has an input 312 and an output 314. The VLSOA 300 further includes a semiconductor gain medium 320, with an amplifying path 330 coupled between the input 312 and the output 314 of the VLSOA 300 and traveling through the semiconductor gain medium 320. The VLSOA 300 further includes a laser cavity 340 including the semiconductor gain medium 320, and a pump input 350 coupled to the semiconductor gain medium 320. The laser cavity 340 is oriented vertically with respect to the amplifying path 330. The pump input 350 is for receiving a pump to pump the semiconductor gain medium 320 above a lasing threshold for the laser cavity 340.

Figure 4:
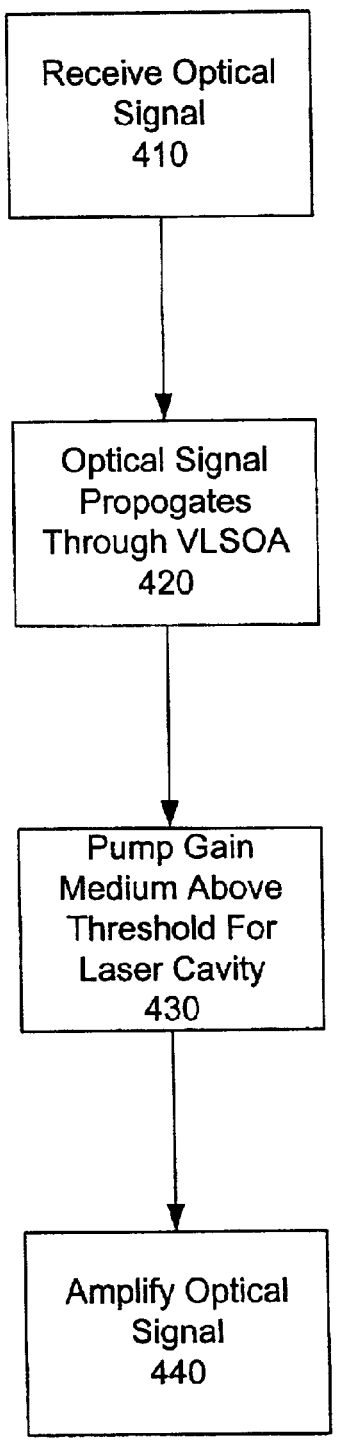
FIG. 4 is a flowchart showing the operation of a lasing semiconductor optical amplifier.

FIG. 4 is a flow diagram illustrating operation of VLSOA 300 when it is used as an amplifier. The VLSOA 300 receives 410 an optical signal at its input 312. The optical signal propagates 420 along the amplifying path 330. The pump received at pump input 350 pumps 430 the semiconductor gain medium above a lasing threshold for the laser cavity 340. When lasing occurs, the round-trip gain offsets the round-trip losses for the laser cavity 340. In other words, the gain of the semiconductor gain medium 320 is clamped to the gain value necessary to offset the round-trip losses. The optical signal is amplified 440 according to this gain value as it propagates along the amplifying path 330 (i.e., through the semiconductor gain medium 320). The amplified signal exits the VLSOA 300 via the output 314.

Note that the gain experienced by the optical signal as it propagates through the VLSOA 300 is determined in part by the gain value of the semiconductor gain medium 320 (it is also determined, for example, by the length of the amplifying path 330) and this gain value, in turn, is determined primarily by the lasing threshold for the laser cavity 340. In particular, the gain experienced by the optical signal as it propagates through each VLSOA 300 is substantially independent of the amplitude of the optical signal. This is in direct contrast to the situation with non-lasing SOAs and overcomes the distortion and cross-talk disadvantages typical of non-lasing SOAs.

Figure 5A:
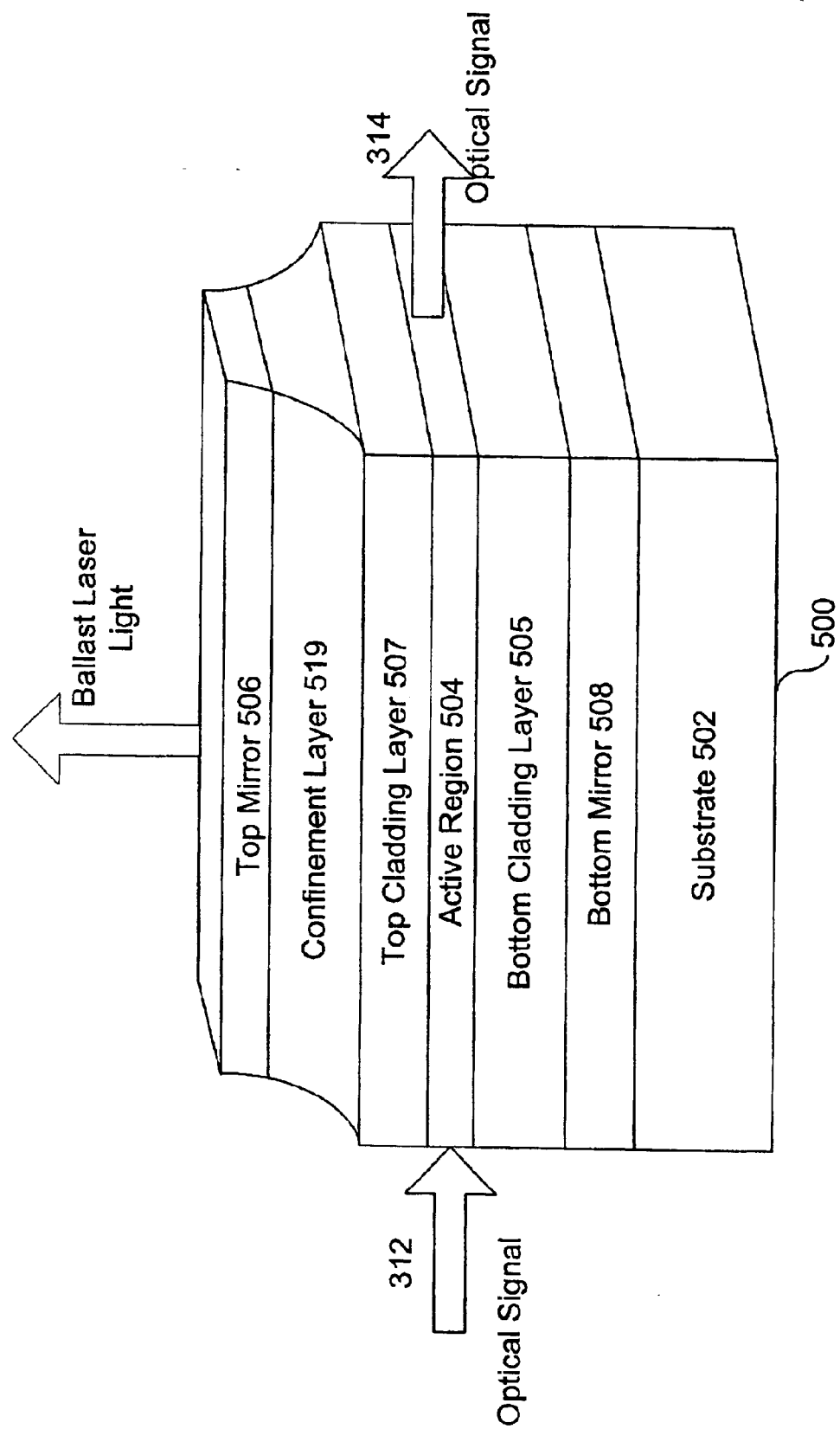
FIG. 5A is a perspective view of an embodiment of a vertical lasing semiconductor optical amplifier (VLSOA) according to the present invention.
Figure 5B:
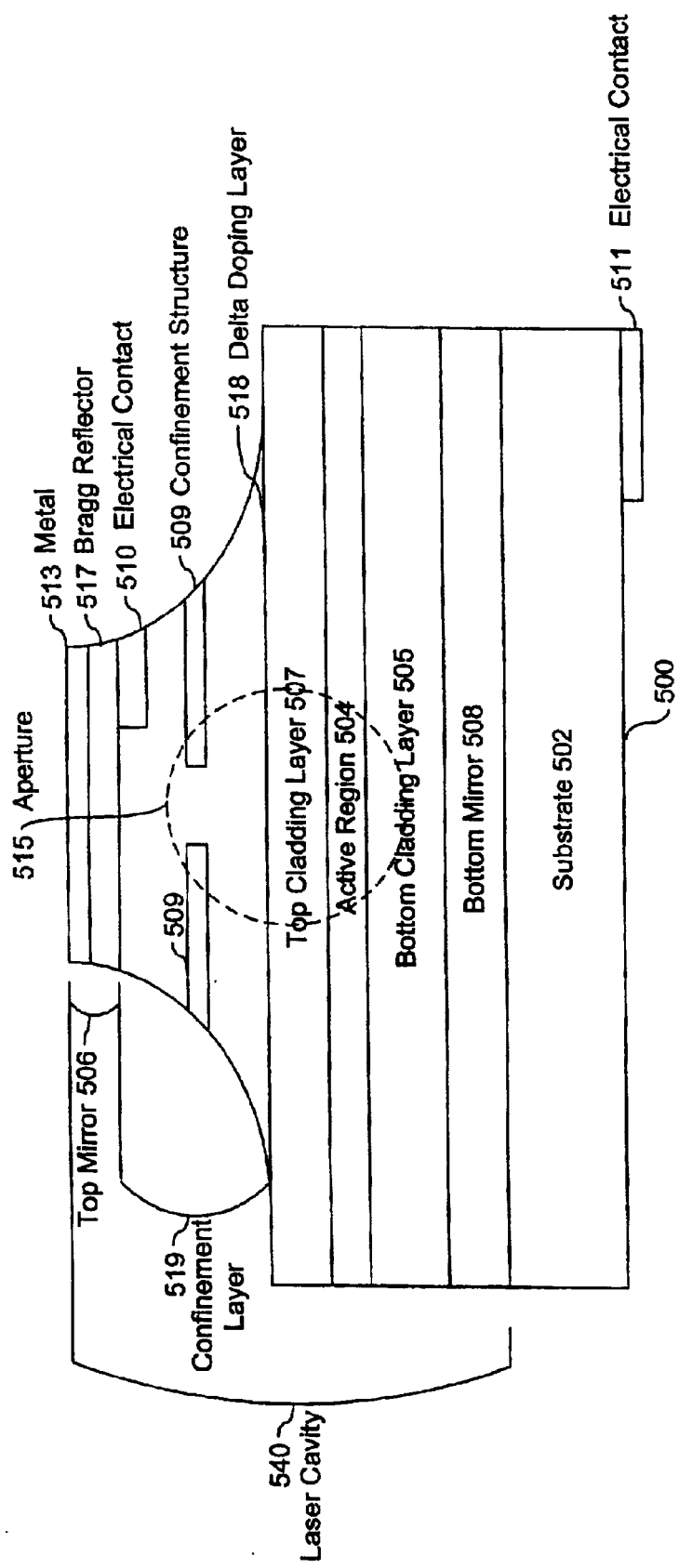
FIG. 5B is a detailed transverse cross-sectional view of an embodiment of a VLSOA according to the present invention.
Figure 5C:
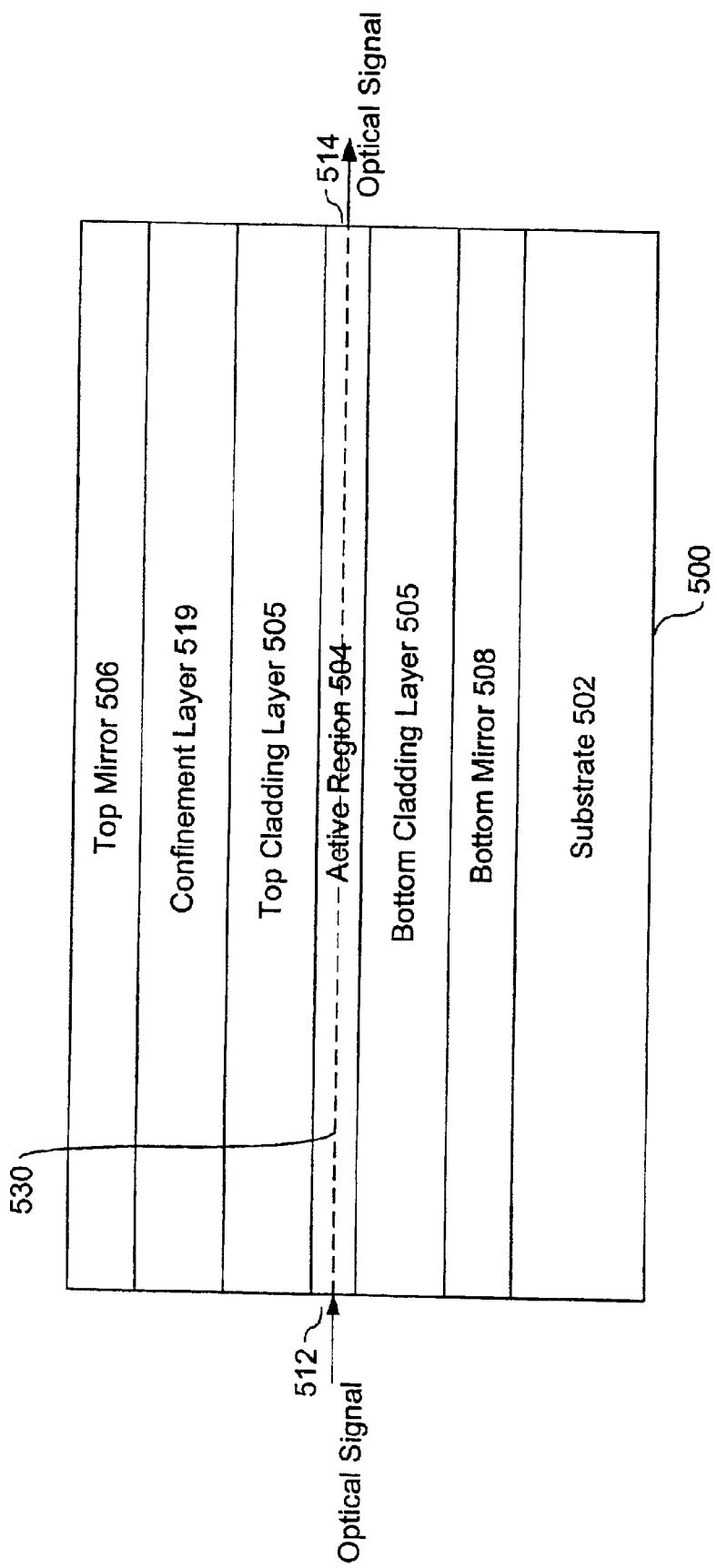
FIG. 5C is a longitudinal cross-sectional view of an embodiment of a VLSOA according to the present invention.

FIGS. 5A–5C are a perspective view, transverse cross-section, and longitudinal cross-section, respectively, of an embodiment of a VLSOA 500 according to the present invention, with FIG. 5B showing the most detail.

Referring to FIG. 5B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 3, the semiconductor gain medium 320 includes the active region 504 and the laser cavity 340 is formed primarily by the two mirrors 506 and 508 and the active region 504. This embodiment is electrically pumped so the pump input 350 includes the electrical contacts 510,511.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 extends primarily in the vertical direction, allowing the VLSOA 500 to be fabricated using standard semiconductor fabrication techniques, preferably including organo-metallic vapor phase epitaxy (OMVPE) or organo-metallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

In more detail, in this embodiment, the substrate 502 is n-doped InP (n-InP), the bottom cladding layer 505 is n-InP, the top cladding layer 507 is p-doped InP (p-InP), and the confinement layer 519 is p-GaAs/AlGaAs. The switch from p-InP in top cladding layer 507 to p-GaAs in confinement layer 519 facilitates the construction of features such as the confinement structure 509 and top mirror 506. GaAs, however, is not lattice-matched to InP, resulting in unwanted electrical effects. The delta doping layer 518, which in this embodiment is a p-type Beryllium (p-Be) doping, counteracts these unwanted electrical effects.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505,507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 5B.

The active region 504 in embodiment 500 includes a double heterostructure (DH) of p-InAlAs/I-InAlGaAs/n-InAlAs. In other embodiments, the active region 504 may comprise a multiple quantum well (MQW) active region. MQW structures include several quantum wells and quantum wells have the advantage of enabling the formation of lasers with relatively low threshold currents. Both double heterostructures and quantum wells may be fabricated using various materials systems, including for example InAlGaAs on InP substrates, InGaAsP on InP, GaInNAs on GaAs, InGaAs on ternary substrates, and GaAsSb on GaAs. An embodiment uses InAlGaAs grown on an InP substrate. GaAs, InGaAs, or InAlGaAs on GaAs; or nitride material systems may also be suitable. Alternatively, the active region 504 may comprise a single quantum well.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In an embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 5 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510 and 511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510 and 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

The integration of VLSOAs with other optical elements may be implemented using any number of techniques. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

In an embodiment, the bottom mirror 508 is a Bragg reflector formed by either alternating layers of InAlGaAs and InAlAs, alternating layers of InGaAsP and InP, alternating layers of GaAs and AlGaAs, or alternating layers of AlGaAsSb and AlAsSb. Top mirror 506 is a hybrid mirror, which combines a number of layers of a Bragg reflector 517 (specifically, alternating layers of GaAs and AlGaAs, and/or alternating layers of Si and $SiO_2$) followed by a metallic mirror 513 (specifically, gold). The mirrors 506 and 508 may comprise other types of Bragg reflectors or other types of non-Bragg mirrors. They typically will have reflectivies in the range of approximately 95–100%. Bragg reflectors are formed by periodic variations of the index of refraction of a medium and can be highly reflective. For example, the Bragg reflector may comprise alternating layers of thicknesses $d_1$ and $d_2$ and refractive indices $n_1$ and $n_2$ such that $n_1 d_1 + n_2 d_2 = \lambda/2$, where $\lambda$ is the wavelength to be reflected. The reflectivity $R = \{[1-(n_1/n_2)^{2N}]/(1+(n_1/n_2)^{2N}]\}^2$, where N is the number of periods (pairs) in the Bragg reflector. Reflectivities as high as 99% or more may be achieved. In addition to the ones described above, Bragg reflectors may be fabricated using various materials systems, such as, for example, alternating layers of GaAs and AlAs, or alternating layers of $SiO_2$ and $TiO_2$.

The electrical contacts 510, 511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier 500. This is advantageous because VLSOA 500 is long in the longitudinal direction and independent pumping allows, for example, different voltages to be maintained at different points along the VLSOA 500. Alternately, the contacts 510 may be doped to have a finite resistance or may be separated by finite resistances, rather than electrically isolated.

Confinement structure 509 is formed by wet oxidizing the confinement layer 519, which consists of GaAs and AlGaAs. The resulting confinement structure 509 is aluminum oxide and the aperture 515 is the unaltered AlGaAs. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

When used as an amplifier, VLSOA 500 operates as follows. Pump current is injected through contacts 510, 511, or, more precisely, holes are injected through contact 510 and electrons through contact 511. These holes and electrons flow to the active region 504, where they increase the carrier density in the active region 504. That is, the pump current is used to pump 430 the active region 504. The pump current is laterally confined by aperture 515 and confinement structure 509. The pump current is sufficiently high to exceed a lasing threshold for vertical cavity 540. As a result, laser radiation is generated by the vertical cavity 540. This laser radiation may be emitted from the vertical cavity, for example, through the top surface 520 or into the substrate 502 or it may be generated but not actually emitted from the VLSOA 500. The laser radiation may lie in the visible, infrared, ultraviolet or other frequency range.

While the laser cavity 540 is operating above the lasing threshold, an optical signal is received 410 at input 512 and propagates 420 through the VLSOA 500 along the amplifying path 530. As the optical signal propagates through the active region 504, the optical signal is amplified 440 by a gain multiplier due to stimulated emission of additional photons. The gain multiplier is substantially constant (i.e., independent of the amplitude of the optical signal) because the laser radiation produced by laser cavity 540 acts as a ballast to prevent gain saturation. That is, when the optical signal is weaker, fewer additional photons are stimulated by the optical signal, but more laser radiation is generated. But when the optical signal is stronger, more additional photons are stimulated by the optical signal, but less laser radiation is generated. Typically, the value of the constant gain multiplier is inversely proportional to the loss of the cavity mirrors 506 and 508. For example, ignoring internal loss, if a 0.2% mirror loss (99.8% reflectivity) results in a gain of 10 dB (10 times), then a three times larger 0.6% loss (99.4% reflectivity) would result in a roughly three times larger logarithmic gain of 30 dB (1000 times) for otherwise identical VLSOAs 500. The amplified signal exits the VLSOA 500 at output 514.

B. VLSOA Output Power Monitor and Control

The following description describes the power monitor and control in relation to a VLSOA. However, the invention may also be used in relation to horizontal, longitudinal and other types of lasing SOAs as understood by those skilled in the art.

Figure 6:
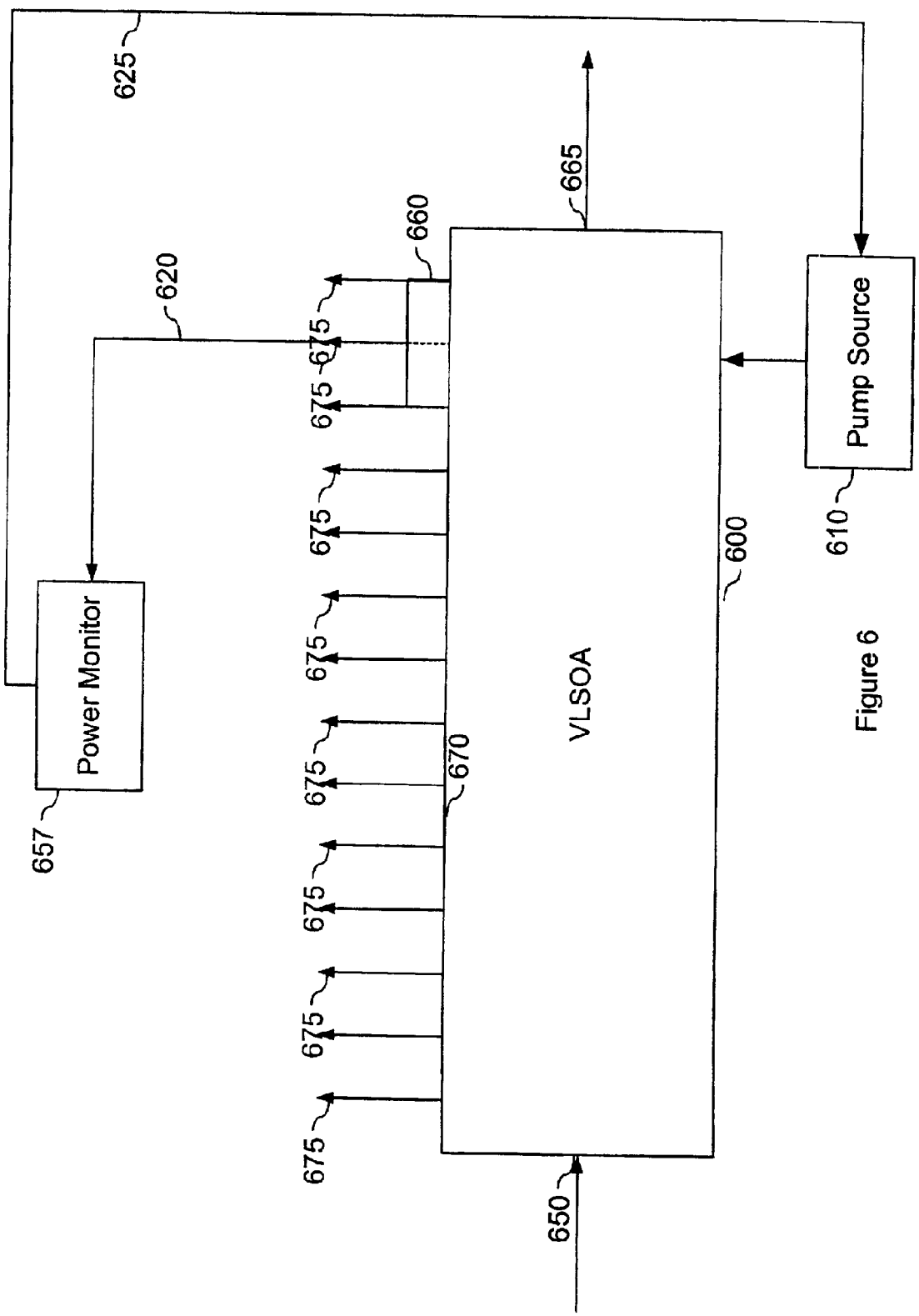
FIG. 6 is an illustration of an embodiment of a VLSOA output power monitor and control according to the present invention.

FIG. 6 illustrates an embodiment of a power monitor according to the present invention. A VLSOA 600 has an input 650, an output 665, and a ballast laser signal emitting surface 670. As previously described, an optical signal enters the VLSOA 600 via input 650 and is amplified. During this amplification, the VLSOA 600 emits a ballast laser signal that acts as a ballast with respect to the amplification process resulting in a clamped gain across the VLSOA 600. This ballast laser signal is emitted through a surface 670 on the VLSOA 600. The intensity of emitted ballast laser signal relates to the level of amplification on the optical signal. Specifically, as the level of amplification on the optical signal increases, the intensity of the ballast laser signal decreases. The intensity of the ballast laser signal may vary across the ballast laser signal emitting surface 670 as the power level of the optical signal is amplified as it propagates along an amplification path within the VLSOA 600. This relationship between the power level of the optical signal within the VLSOA 600 and the intensity of the ballast laser signal allows the output power of the VLSOA 600 to be identified. Additionally, the emitted ballast laser signal may be used to identify when the VLSOA 600 is saturated or approaching saturation. For example, the VLSOA 600 becoming saturated results in extinguishing ballast laser light within the laser cavity of the VLSOA 600 causing the intensity of the emitted ballast laser light to go to a small magnitude (e.g., zero).

A detector 660 is coupled proximate to the ballast laser signal emitting surface 670 so that it can convert the ballast laser signal to an electrical signal. According to one embodiment, shown in FIG. 6, the detector 660 is coupled to the ballast laser signal emitting surface 670. This coupling may be done by integrating the detector 660 directly onto the ballast laser signal emitting surface 670. The detector 660 converts the ballast laser signal to an electrical signal. Examples of the detector 660 include both a PIN diode and an avalanche photodiode. The detector 660 is also coupled to a power monitor 657 via line 620 on which the electrical signal travels.

The power monitor 657 receives the electrical signal from the line 620 in order to determine whether the VLSOA 600 is saturated or approaching saturation. According to one embodiment, the power monitor 657 includes a comparator that identifies when the intensity of the ballast laser signal is very small (e.g., approximately zero) indicating that the VLSOA 600 is saturated. An example of a comparator is a bistable circuit such as a Schmitt trigger that will generate a positive output when the power level drops below a particular threshold. This threshold may be set to trigger the Schmitt trigger when the VLSOA 600 is approaching saturation (i.e., when the intensity level of the ballast laser signal is small) or when the VLSOA is saturated (i.e., when the intensity level of the ballast laser signal is negligible or zero). According to this embodiment, after the threshold is crossed, the power monitor 657 signals a pump source 610 to increase the output power on the VLSOA 600 to avoid saturation. Alternatively, an analog feedback loop with appropriate feedback compensation for specific network switching transients can be employed.

The pump source 610 is coupled to the power monitor via line 625 and to the active region within the VLSOA. Examples of pump sources include current, voltage, and power sources. The pump source 610 provides an electrical pump current that pumps the active region so that the laser cavity surrounding the active region operates above a lasing threshold. Specifically, the electrical pump current creates electron-hole pairs within the active region that provide energy that will be used in amplifying the optical signal. If this electrical pump current is increased, then the rate at which electron-hole pairs are created within the active region increases. Comparatively, if the electrical pump current decreases, then the rate at which electron-hole pairs are created decreases.

The pumps source 610 adjusts the electrical pump current level in response to the power monitor 657 to protect against the VLSOA 600 saturating. In one embodiment, the electrical pump current increases as the VLSOA 600 begins to approach saturation. The power monitor 657 identifies if the VLSOA 600 is approaching saturation by comparing the electrical signal on line 620 to a threshold value. In response to this threshold value being crossed, the pump source 610 increases the electrical pump current. The increase in the electrical pump current produces electron-hole pairs within the active region at a faster rate. As a result, the saturation level of the VLSOA 600 and the corresponding output power increase. In the analog feedback loop, one can talk about a small, delta-change, from the ideal output power and the resulting small changes in pump current to compensate. Pre-emphasis or de-emphasis can be employed in the frequency response of the loop to handle network conditions. Additionally, diodes or other nonlinear response elements can be used to tailor the response as needed in network conditions. All of the elements can be employed with traditional analog or digital signal processing methods including microprocessors. The feedback loop response elements can also be included in the alarm system as well as microprocessors.

A second embodiment operates to bring a VLSOA 600 out of saturation. In this embodiment, the power monitor 657 determines if the electrical signal level on line 620 is approximately zero. A very small or non-existent electrical signal indicates that the VLSOA 600 is saturated. In response, the pump source 610 increases the electrical pump current which increases the VLSOA 600 saturation level and corresponding output power.

Thus, the present invention dynamically adjusts the electrical pump current according to the amplification of the optical signal. Additionally, the present invention provides network designers and managers an efficient way to adjust optical amplifiers as networks are scaled.

C. Saturation Protection for VLSOA

Figure 7:
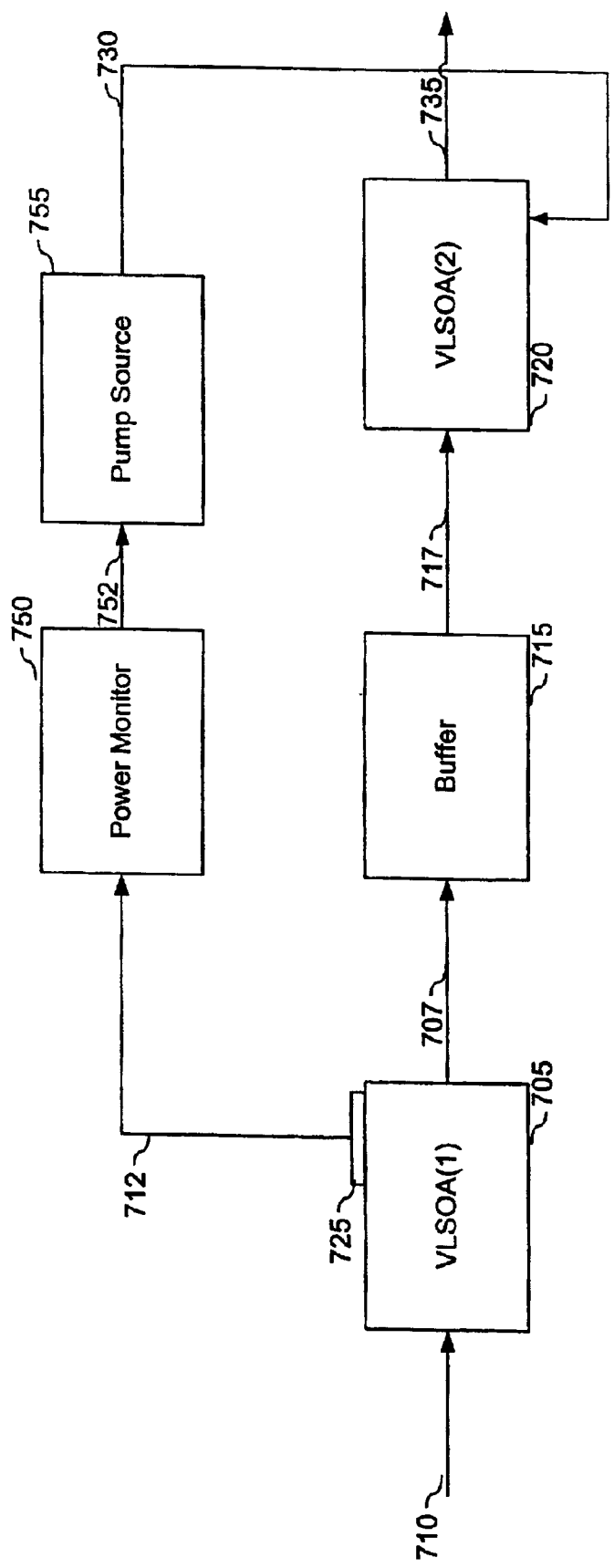
FIG. 7 is an illustration of another embodiment of VLSOA output power monitor and control according to the present invention.

The following embodiment is a feed-forward architecture. Feedback architectures are equally possible. FIG. 7 illustrates another embodiment of VLSOA output power monitor and control according to the present invention. A first VLSOA 705 has an input 710 and amplifies an optical signal in the manner described above. A ballast laser signal is emitted from the first VLSOA 705 during this amplification process. A detector 725 is positioned to receive the ballast laser signal. The detector 725 may include a PIN diode or avalanche photodiode. In this example, the detector 725 is integrated on a ballast laser emitting surface of the first VLSOA 705, and converts this ballast laser signal to an electrical signal. This electrical signal is then transmitted to a power monitor 750 via line 712.

The power monitor 750 uses the electrical signal on line 712 to determine whether the first VLSOA 705 is approaching saturation or is currently saturated. In one embodiment, the power monitor 750 comprises a comparator (e.g., a Schmitt trigger or an analog comparator is fine as well. Once again, frequency compensation elements can be employed. These elements can either be pure analog or accomplished by digital signal processing methods) that identifies when the electrical signal on line 712 drops below a particular level indicative of the first VLSOA 705 approaching saturation or already being saturated. The power monitor 750 transmits a signal on line 752 to the pump source 755 that indicates that the first VLSOA 705, or the last VLSOA 720, or any other part of the network is in danger of saturating or is already saturated.

The pump source 755 is coupled to the power monitor 750 via line 752 and to a second VLSOA 720 vial line 730. The pump source 730 controls the saturation level of a second VLSOA 720 by adjusting the rate at which an active region within the second VLSOA 720 is pumped. This configuration allows the second VLSOA 720 to avoid saturation by increasing the rate of the pump source 755 in response to the detected power level on the first VLSOA 705. According to this embodiment, the output of the first VLSOA 705 is coupled to an input on a buffer 715 via line 707. This buffer 715 functions to delay the optical signal a sufficient period of time so that the power monitor 750 and pump source 755 may adjust the output power of the second VLSOA 720 according to the power level on the first VLSOA 705. Additionally, this buffer can be replaced or augmented by a variable optical attenuator (VOA), or tunable gain VLSOA or tunable gain OA of another sort and the control signal 730 or 752 can be used to control these elements to adjust the signal level to a constant level that prevents saturation of the last VLSOA 720 or any other part of the network.

An optical buffer, as described, may be replaced by an optically transparent buffer such as an optical fiber or delay line. Furthermore, if the response times of the feedforward circuits are fast enough, then few bits will be lost. In particular, the speed of these circuits is defined as a rate at which a pertubation is switched into the system; it is unlikely to be at the bit rate unless applied to packet switched networks. In such an instance, one may allow a pulse-modulated train of bits to slowly build up intensity.

The second VLSOA 720 provides a layer of protection against saturation because the rate at which the active region within the second VLSOA 720 is adjusted according to power level detection of the amplified optical signal transmitted from the first VLSOA 705. As a result, amplifier saturation related problems such as crosstalk within the optical signal may be avoided. Also, the power level on the amplified signal is detected without actually tapping the signal so that traditional detection losses are avoided.

D. Monitor and Control of Output Power for Multiple VLOAs

Figure 8:
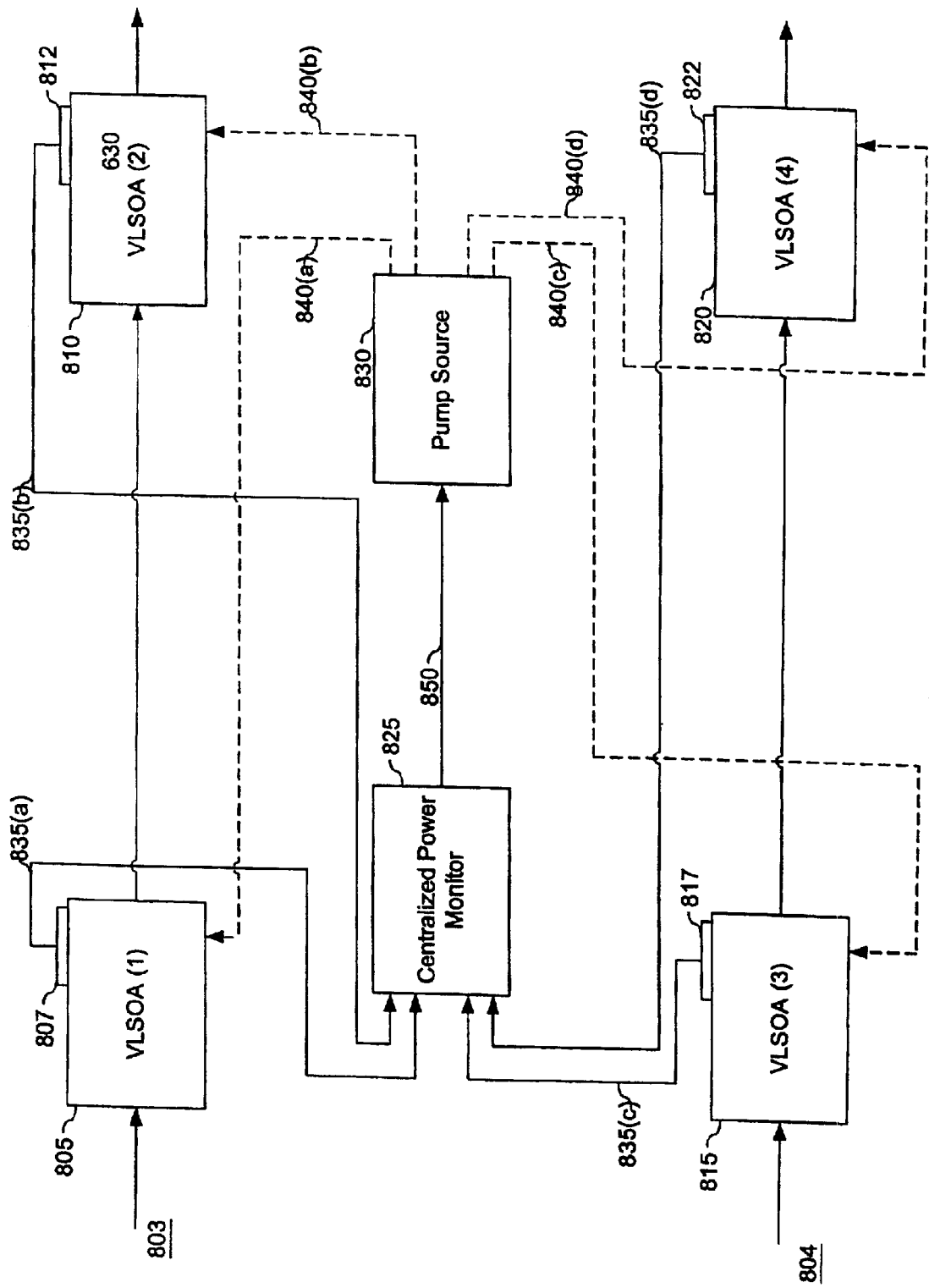
FIG. 8 is an illustration of a centralized output power monitor and control attached to multiple VLSOAs according to the present invention.

FIG. 8 illustrates a centralized power output monitor and control for multiple VLSOAs within multiple paths 803, 804 according to the present invention. FIG. 8 shows two paths comprising at least two VLSOAs 805, 810, 815, 820 in each path. A first path 803 comprises a first VLSOA 805 coupled to a second VLSOA 810. A first detector 807 is positioned proximate to the first VLSOA 807 so that a ballast laser signal from the first VLSOA 805 may be detected. A second detector 812 is positioned in a similar manner in relation to the second VLSOA 810. The first detector 807 is coupled to a central power monitor 825 via line 835(*a*) and the second detector 812 is coupled to the central power monitor 825 via line 835(*b*).

A second path 804 also comprises a third VLSOA 815 and a fourth VLSOA 820. A third detector 817 is positioned proximate to the third VLSOA 815 so that a ballast laser signal from the third VLSOA 815 may be detected. A fourth detector 822 is positioned in a similar manner in relation to the fourth VLSOA 820. The third detector 815 is coupled to the central power monitor 825 via line 835(*c*) and the fourth detector 822 is coupled to the central power monitor 825 via line 835(*d*).

The central power monitor 825 may be an analog or digital circuit that monitors each of the VLSOAs via a corresponding line 835 from a particular detector. The central power monitor 825 is coupled to a pump source 830. The pump source 830 is coupled to each VLSOA and, in particular, to an active region within each VLSOA. For example, the pump source 830 is coupled to the first VLSOA 805 and, in particular, to an active region within the first VLSOA 805 via line 835(*a*). This embodiment centralizes power output control at a single point on a chip resulting in easier maintenance and more available space for other components.

The central power monitor 825 identifies whether a VLSOA is approaching saturation or is saturated by monitoring the signal lines 835 from each of the detectors. One particular embodiment of the central power monitor 825 comprises a plurality of comparators where a particular comparator monitors a particular VLSOA. The central power monitor 825 transmits a signal to the pump source 830 when a particular VLSOA is saturated or approaching saturation. The pump source 830 increases the rate at which the active region within the particular VLSOA is pumped via a particular line 840. For example, the central power monitor 825 may identify the first VLSOA 805 as being saturated. This information is transmitted to the pump source 830 via line 850. In response, the pump source 830 increases the rate at which the active region within the first VLSOA 805 is pumped. This increase raises the saturation level of the first VLSOA 805 and hinders saturation. As a result, the first VLSOA 805 is capable of providing a higher output power level. Additionally, as stated before, a VOA, or tunable gain element can be inserted between the two VLSOAs in each path and can be controlled to keep the power levels below saturation within or external to the optical amplifier sub-assembly.

E. Method for Monitor and Control of VLSOA Output Power

Figure 9:
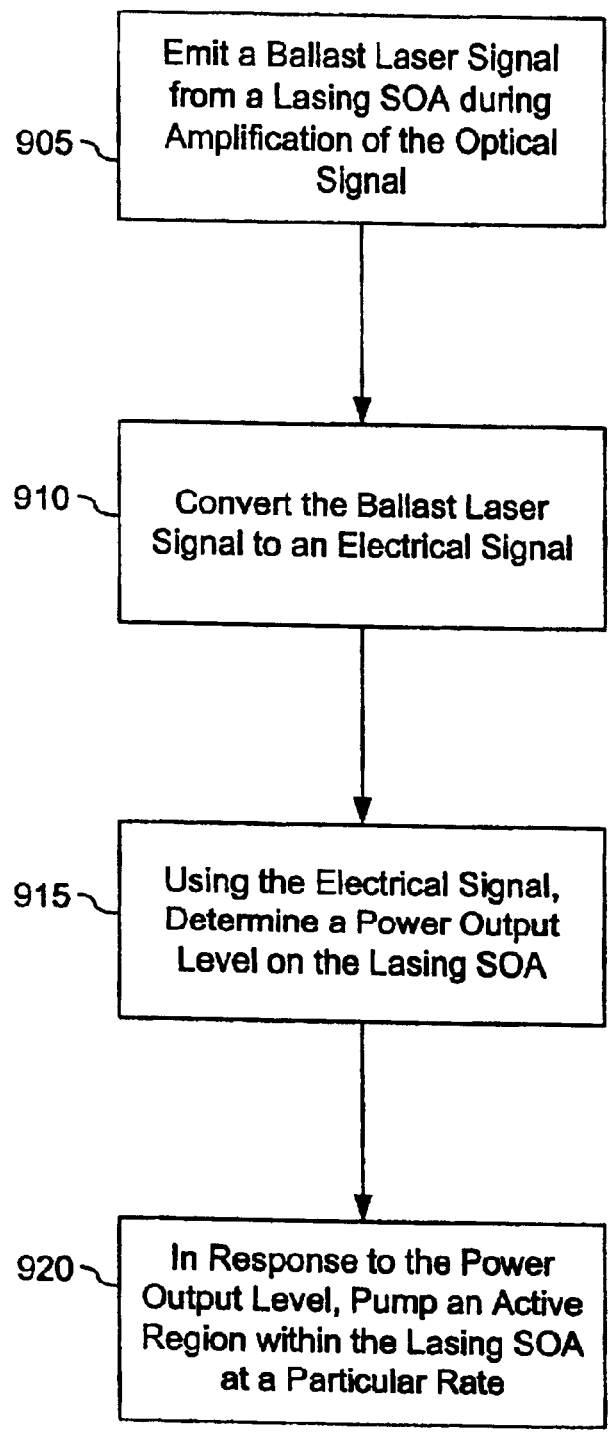
FIG. 9 is a flowchart illustrating a VLSOA output power monitor and control method according to the present invention.

FIG. 9 is a flowchart that illustrates a method for monitoring and controlling the output power and saturation level of a VLSOA according to the present invention. As described above, a lasing SOA (e.g., vertical, horizontal or longitudinal) emits 905 a ballast laser be signal during amplification of an optical signal. The intensity of the ballast laser signal relates to the power level of the optical signal within the lasing SOA. This ballast laser signal from the lasing SOA is converted 910 to an electrical signal. Because of this conversion, the levels on this electrical signal relate to the power levels on the optical signal. In one embodiment, the level on the electrical signal is approximately inversely proportional to the power levels on the optical signal.

Using this electrical signal, the output power on the lasing SOA is identified 915. In one embodiment, a lasing SOA that is either saturated or approaching saturation is identified by its corresponding power output. In response to identifying the lasing SOA power output, the rate at which an active region within lasing SOA is pumped may be adjusted 920. For example, a lasing SOA that is saturated or approaching saturation requires that the pumping rate of its active region increase. This rate increase provides a faster generation of electron-hole pairs within the active region which increases the saturation level of the lasing SOA. As a result of this saturation level increase, the available output power of the lasing SOA increases as well.

This process provides a layer of protection against saturating a lasing optical amplifier. This protection reduces the likelihood of crosstalk and other negative effects of saturated optical amplifiers. Additionally, this method provides a network power monitoring system that enhances the ability of a network manager to manage a network. For example, occurrences such as component failure and traffic congestion may be identified within a network as a result of this method.

While the present invention has been described with reference to certain embodiments, those skilled in the art will recognize that various modifications may be provided. For example, various other types of lasing semiconductor optical amplifiers may be used in replace of a VLSOA within the above-described embodiments. These lasing semiconductor optical amplifiers include longitudinal lasing semiconductor optical amplifiers and transverse lasing semiconductor optical amplifiers. Furthermore, it is important to note that all of the above monitoring techniques and sub-systems may be monolithically integrated onto a single substrate or integrated with various techniques including, but not limited to, photonic integrated circuit platforms in silicon or other substrates, bump solder-bonding, wafer fusion bonding, or any other means of integration. Variations upon and modifications to the embodiments are provided for by the present invention, which is limited only by the following claims.

We claim:

1. An apparatus for amplifying an optical signal, comprising:

a vertical cavity lasing SOA for amplifying an optical signal traveling through an active region of the lasing SOA and outputting an amplified optical signal, wherein a ballast laser signal produced by the vertical cavity lasing SOA acts as a ballast with respect to the amplification of the optical signal;

a detector coupled to a surface of the lasing SOA that emits the ballast laser signal to convert the ballast laser signal to an electrical signal; and a power monitor, coupled to the detector, for analyzing the electrical signal to determine a power level of the ballast laser signal, wherein a pumping current of the vertical cavity lasing SOA is adjusted based on the power level of the ballast laser signal to amplify the optical signal.

2. The apparatus of claim 1, wherein the vertical cavity lasing SOA further comprises:

an input for receiving the optical signal;

a laser cavity coupled to the input, the laser cavity adapted to amplify the optical signal and output the ballast laser signal; and an output coupled to the laser cavity, the output adapted to transmit the amplified optical signal from the lasing SOA.

3. The apparatus of claim 2, wherein the laser cavity comprises:

a top mirror;

a bottom mirror;

an active region positioned between the top mirror and the bottom mirror; and a pump coupled to the active region, the pump adapted to increase a carrier density population within the active region.

4. The apparatus of claim 2 wherein the laser cavity is oriented vertically with respect to an amplification path of the optical signal.

5. The apparatus of claim 2 wherein the laser cavity is oriented horizontally with respect to an amplification path of the optical signal.

6. The apparatus of claim 2 wherein the laser cavity is oriented transversely with respect to an amplification path of the optical signal.

7. The apparatus of claim 2 wherein the detector is positioned near the output of the lasing SOA.

8. The apparatus of claim 2 wherein the detector and the lasing SOA are integrated on the same substrate.

9. The apparatus of claim 1 wherein the detector comprises a PIN diode.

10. The apparatus of claim 1, wherein the detector comprises an avalanche photodiode.

11. The apparatus of claim 1 wherein the power monitor comprises a comparator that determines if the vertical cavity lasing SOA is approaching saturation.

12. The apparatus of claim 11 wherein the comparator comprises a Schmitt trigger.

13. The apparatus of claim 1 further comprising a pump source, coupled to the power monitor and the lasing SOA, that pumps a gain medium within the vertical cavity lasing SOA in response to the power monitor.

14. A vertical cavity lasing SOA output power detection and control system comprising:

a plurality of vertical cavity lasing SOAs for amplifying at least one optical signal, each vertical cavity lasing SOA outputting a ballast laser signal which acts as a ballast with respect to the amplification of the at least one optical signal in each lasing SOA;

at least one detector coupled with each lasing SOA, each detector converting a particular ballast laser signal to an electrical signal; and a power monitor coupled to the at least one detector, wherein the power monitor analyzes each electrical signal from each detector to determine a power level of each ballast laser signal, wherein a pump current of each lasing SOA is adjusted based on the power level of each corresponding ballast laser signal such that an output signal of each vertical cavity lasing SOA is amplified without saturating the vertical cavity lasing SOA.

15. The detection and control system of claim 14 wherein the at least one vertical cavity lasing SOA and the at least one detector are integrated on the same substrate.

16. The detection and control system of claim 14 wherein the at least one detector comprises a PIN diode.

17. The detection and control system of claim 14 wherein the at least one detector comprises an avalanche photodiode.

18. The detection and control system of claim 14 wherein the power monitor comprises at least one comparator that determines if the at least one vertical cavity lasing SOA is approaching saturation.

19. The detection and control system of claim 14 further comprising a pump source, coupled to the power monitor and the at least one vertical cavity lasing SOA, that pumps a gain medium within the vertical cavity lasing SOA in response to the power monitor.

20. A method for controlling an output power of an optical signal amplified in a lasing SOA, the method comprising the steps of:

amplifying an optical signal as the optical signal travels through an active region of a lasing SOA:

outputting a ballast laser signal from the lasing SOA, wherein the ballast laser signal acts as a ballast with respect to amplification of the optical signal;

detecting the ballast laser signal with a detector coupled to the lasing SOA; monitoring a power of the detected ballast laser signal; and adjusting a pumping current of the lasing SOA to control amplification of the output optical signal and to prevent the lasing SOA from saturation based on the power of the detected ballast laser signal.

21. The method of claim 20 further comprising the step of controlling the output power of the lasing SOA in response to detected ballast laser signal.

22. The method of claim 21, further comprising controlling the output power of the lasing SOA with a pump source that pumps the active region within the lasing SOA.

23. The method of claim 20, further comprising orienting a laser cavity of the lasing SOA vertically with respect to an amplification path of the optical signal.

24. The method of claim 20, further comprising orienting a laser cavity of the lasing SOA horizontally with respect to an amplification path of the optical signal.

25. The method of claim 20, further comprising orienting a laser cavity of the lasing SOA transversely with respect to an amplification path of the optical signal.

26. The method of claim 20, further comprising detecting the ballast laser signal of the lasing SOA with a PIN diode.

27. The method of claim 20, further comprising detecting the ballast laser signal of the lasing SOA with an avalanche photodiode.

28. The method of claim 20, further comprising monitoring the power of the amplified optical signal with a comparator.

29. The method of claim 20 further comprising the steps of:

delaying the optical signal; and controlling the output power of a second lasing SOA that further amplifies the optical signal in response to the detected ballast laser signal.

30. The method of claim 29, further comprising delaying the optical signal using an electrical buffer.

31. The method of claim 29, further comprising delaying the optical signal using an optical buffer.

32. The method of claim 29, further comprising controlling an output power of the second lasing SOA by an adjustable pump source that pumps an active medium with the second lasing SOA.

33. A lasing semiconductor optical amplifier (SOA) comprising:

a first lasing SOA that outputs a ballast laser signal that acts as a ballast to an optical signal being amplified by the first lasing SOA;

a detector coupled to the first lasing SOA, wherein the detector detects the ballast laser signal and converts the laser ballast signal to an electrical signal;

a power monitor than analyzes the electrical signal to determine whether the first lasing SOA is saturated or is approaching saturation; and a pump source that adjusts an output power of a second lasing SOA in response to a signal from the power monitor, the second lasing SOA further amplifying the optical signal.

34. An apparatus as defined in claim 33, further comprising a buffer that delays the optical signal between the first lasing SOA and the second lasing SOA a period of time for the power monitor to generate the signal that adjusts the output power of the second lasing SOA.

35. An apparatus as defined in claim 33, further comprising an optical element that acts on the optical signal output by the first lasing SOA to prevent the optical signal from saturating the second lasing SOA, wherein the element is at least one of: a variable optical attenuator; a tunable gain vertical lasing SOA; and a tunable gain optical amplifier.

36. An apparatus as defined in claim 14, wherein at least two of the plurality of lasing SOAs amplify the same optical signal.

* * * * *

UNITED STATES PATENT AND TRADEMARK OFFICE
CERTIFICATE OF CORRECTION

PATENT NO.       : 6,801,555 B1
APPLICATION NO.  : 10/092455
DATED            : October 5, 2004
INVENTOR(S)      : DiJaili et al.

It is certified that error appears in the above-identified patent and that said Letters Patent is hereby corrected as shown below:

Title Page, Item [56]
Page 2, under OTHER PUBLICATIONS, Column 1, Line 10, change "1988" to --1998--
Page 2, under OTHER PUBLICATIONS, Column 1, Line 12, after "Gain-Clamped" remove "Clamped"
Page 2, under OTHER PUBLICATIONS, Column 1, Line 31 and 32, change "Cross-Conected" to --Cross-Connect--
Page 2, under OTHER PUBLICATIONS, Column 1, Line 42, change "IBEE" to --IEEE--
Page 2, under OTHER PUBLICATIONS, Column 1, Line 45, change "IBEE" to --IEEE--
Page 2, under OTHER PUBLICATIONS, Column 2, Line 34, change "Distrotion" to --Distortion--
Page 2, under OTHER PUBLICATIONS, Column 2, Line 35, change "IEE" to --IEEE--
Page 2, under OTHER PUBLICATIONS, Column 2, Line 53 and 54, change "PolarizationIn-sensitive" to --Polarization-Insensitive--

Column 5
Line 36, change "have" to --has--

Column 10
Line 20, change "$R=\{[1-(n_1/n_2)^{2N}]/(1+n_1/n_2)^{2N}|\}^2$" to -- $R=\{[1-(n_1/n_2)^{2N}]/[1+n_1/n_2)^{2N}]\}^2$ --

Column 13
Line 52, after "pump source" change "730" to --755--

Column 14
Line 22, change "VLOAs" to --VLSOAs--
Line 29, after "VLSOA" change "807" to --805--

UNITED STATES PATENT AND TRADEMARK OFFICE
CERTIFICATE OF CORRECTION

PATENT NO. : 6,801,555 B1
APPLICATION NO. : 10/092455
DATED : October 5, 2004
INVENTOR(S) : DiJaili et al.

It is certified that error appears in the above-identified patent and that said Letters Patent is hereby corrected as shown below:

Column 15
Line 20, after "ballast laser" remove "be"
Line 55, change "replace" with --place--

Signed and Sealed this

Eleventh Day of September, 2007

JON W. DUDAS
*Director of the United States Patent and Trademark Office*